United States Patent [19]
Chen et al.

[11] Patent Number: 6,077,742
[45] Date of Patent: Jun. 20, 2000

[54] METHOD FOR MAKING DYNAMIC RANDOM ACCESS MEMORY (DRAM) CELLS HAVING ZIGZAG-SHAPED STACKED CAPACITORS WITH INCREASED CAPACITANCE

[75] Inventors: Li Yeat Chen, Hsinchu; Sen-Huan Huang, Tainan, both of Taiwan

[73] Assignee: Vanguard International Semiconductor Corporation, Hsin-Chu, Taiwan

[21] Appl. No.: 09/066,017

[22] Filed: Apr. 24, 1998

[51] Int. Cl.[7] .................... H01L 21/8242; H01L 27/108
[52] U.S. Cl. .................... 438/255; 438/398; 257/309
[58] Field of Search .................... 438/253, 254, 438/255, 396, 397, 398

[56] References Cited

U.S. PATENT DOCUMENTS

| | | | |
|---|---|---|---|
| 5,155,657 | 10/1992 | Oehrlein et al. | 361/313 |
| 5,330,928 | 7/1994 | Tseng | 438/254 |
| 5,436,186 | 7/1995 | Hsue et al. | 438/397 |
| 5,545,585 | 8/1996 | Wang et al. | 438/397 |
| 5,573,967 | 11/1996 | Tseng | 438/254 |
| 5,597,756 | 1/1997 | Fazan et al. | 438/398 |
| 5,677,222 | 10/1997 | Tseng | 438/255 |
| 5,843,822 | 12/1998 | Hsia et al. | 438/254 |
| 5,851,898 | 12/1998 | Hsia et al. | 438/398 |
| 5,909,621 | 6/1999 | Hsia et al. | 438/254 |
| 5,956,587 | 9/1999 | Chen et al. | 438/255 |

*Primary Examiner*—Olik Chaudhuri
*Assistant Examiner*—William David Coleman
*Attorney, Agent, or Firm*—George O. Saile; Stephen B. Ackerman

[57] ABSTRACT

DRAM cells having zigzag-shaped stacked capacitors with hemispherical gain (HSG) surfaces to increase capacitance is achieved. FET gate electrodes are formed having a planar first insulating layer thereon. Contact openings are etched for bit line contacts and capacitor node contacts. A first polysilicon layer having a top silicide layer is patterned to form bit lines and node contacts. A planar second insulating layer is formed with openings to the node contacts, which are filled with a second polysilicon to form electrical connections. A etch-stop layer is deposited followed by a multilayer composed of alternating layers of phosphosilicate and borosilicate glass. Recesses are etched in the multilayer to the node contacts, and the sidewalls in the recesses are isotropically etched to form a zigzag profile. A doped amorphous silicon layer is deposited and treated to form a HSG layer. An insulating layer is formed in the recesses to provide an etch mask and the HSG layer is etched back. The multilayer and the insulating layer are removed to provide zigzag-shaped/HSG capacitor bottom electrodes. An interelectrode dielectric layer is deposited, and a patterned fourth polysilicon layer is used to form the top electrodes to complete the array of capacitors.

24 Claims, 8 Drawing Sheets

METHOD FOR MAKING DYNAMIC RANDOM ACCESS MEMORY (DRAM) CELLS HAVING ZIGZAG-SHAPED STACKED CAPACITORS WITH INCREASED CAPACITANCE

BACKGROUND OF THE INVENTION (1) Field of the Invention

The present invention relates to semiconductor integrated circuits, and more particularly to a method for fabricating an array of dynamic random access memory (DRAM) cells with zigzag-shaped stacked capacitors and a hemispherical grain (HSG) process to increase the capacitance while maintaining a high density of memory cells.

(2) Description of the Prior Art

Dynamic random access memory (DRAM) circuits (devices) are extensively used in the electronics industry, and more particularly in the computer industry for storing data in binary form (1 and 0) as charge on a storage capacitor. These DRAM devices are made on semiconductor substrates (or wafers) and then the substrates are diced to form the individual DRAM circuits (or DRAM chips). Each DRAM circuit (chip) consists in part of an array of individual DRAM storage cells that store binary data (bits) as electrical charge on a storage capacitor. Further, the information is stored and retrieved from the storage capacitor by means of switching on or off a single access transistor (by way of word lines) in each memory cell using peripheral address circuits, while the charge is stored on the capacitor or sensed by way of bit lines and by read/write circuits formed on the periphery of the DRAM chip.

The access transistor for the DRAM device is usually a field effect transistor (FET), and the single capacitor in each cell is either formed in the semiconductor substrate as a trench capacitor, or built over the FET in the cell area as a stacked capacitor. To maintain a reasonable DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide an acceptable signal-to-noise level for the read circuits (sense amplifiers) to detect. The reduced charge also requires more frequent refresh cycles that periodically restore the charge on these volatile storage cells. This increase in refresh cycles further reduces the performance (speed) of the DRAM circuit.

Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the access transistors within each cell area, rather than forming trench capacitors which need to be etched to increasing depths in the substrate to maintain the necessary capacitance. The stacked capacitors also provide increased latitude in capacitor design and processing while reducing cell area. More specifically, the stacked capacitors can be extended in the vertical direction (third dimension) to increase the stacked capacitor area, and therefore to increase the capacitance.

Numerous methods of making DRAM circuits using stacked capacitors having crown shapes, fin shapes and the like have been reported in the literature. One method of overcoming this size problem is described by Wang et al. in U.S. Pat. No. 5,545,585. In this method of forming a fin-shaped capacitor, a node contact opening is etched in a disposable multilayer of alternate layers of doped and undoped oxides, and then the doped oxide layers are selectively etched to form a template on which is formed a fin-shaped capacitor bottom electrode. Another approach for making fin-shaped capacitors is taught by Hsue et al. in U.S. Pat. No. 5,436,186. Hsue also uses alternate layers of doped oxides as a disposable template on which to form the capacitor bottom electrodes. In U.S. Pat. No. 5,573,967, Tseng describes a method for making a fin-shaped capacitor in which an alternate polysilicon and oxide layer stack is patterned and the oxide is recessed by etching to form the fin-shaped capacitor bottom electrode. Still another method for making a fin-shaped capacitor is described by Tseng in U.S. Pat. No. 5,330,928 in which node contact openings are etched in a multilayer of alternate layers of silicon oxide and polysilicon. The polysilicon layers are then recessed to for fin-shaped capacitor bottom electrodes. Another method for making fin-shaped capacitors using multilayers of alternate layers of dissimilar conducting layers is described by Oehrlein et al. in U.S. Pat. No. 5,155,657. In this approach the inventors use alternate layers of polysilicon (Si) and polygermanium (Ge) in one embodiment and alternate layers of polysilicon and carbon (C) in a second embodiment of the invention. The multilayer is patterned leaving portions over the capacitor node contacts and an isotropic etch is used to etch selectively either layer to form a fin-shaped bottom electrode. A method for making a cup-shaped DRAM capacitor is described by Fazan in U.S. Pat. No. 5,597,756. Depressions are etched in a stacked layer of a first tetraethosiloxane (TEOS) oxide, a first silicon nitride, a second TEOS oxide, a second silicon nitride layer, and a borophosphosilicate (BPSG) oxide layer. An amorphous silicon bottom electrode is formed in the depression and hemispherical grain (HSG) polysilicon asperities are formed on the electrode to increase the capacitance.

Although there has been considerable work done to increase the capacitance area on these miniature DRAM stacked capacitors, there is still a need to further increase the capacitance in the unit DRAM cell while maintaining a simple process using self-aligning techniques to minimize the number of masking steps.

SUMMARY OF THE INVENTION

A principal object of the present invention to provide DRAM cells using zigzag-shaped capacitor bottom electrodes formed from a hemispherical grain (HSG) polysilicon layer that further increases the capacitance of a DRAM cell over the prior art.

Another object of this invention is to form these zigzag-shaped capacitor bottom electrodes using a disposable multilayer of alternately doped silicon oxide layers having differing etch rates. The multilayer is patterned having vertical sidewalls, and is then subjected to an isotropic etch to form a template on which the zigzag-shaped capacitor bottom electrodes having a HSG structure are formed.

Another object of the invention is to provide these improved stacked capacitors while providing a cost-effective manufacturing process.

The method for making these DRAM cells with HSG zigzag-shaped stacked capacitors begins by providing a semiconductor substrate. Typically the substrate is a single-crystal silicon substrate doped with a P type conductive dopant, such as boron (B). A relatively thick Field OXide (FOX) is formed surrounding and electrically isolating device areas. The field oxide is typically formed using the LOCal Oxidation of Silicon (LOCOS) method, in which a patterned silicon nitride ($Si_3N_4$) layer is used to mask the device areas from oxidation while the silicon substrate in the FOX areas is thermally oxidized to the desired thickness. Other field oxide isolations can also be used, such as shallow trench isolation (STI) and the like. A thin gate oxide is then formed in the device areas of the silicon substrate for the FETs. A polycide (polysilicon/silicide) layer, having a cap oxide ($SiO_2$) thereon, is patterned to form the FET gate electrodes and the interconnecting word lines for the array of memory cells on the DRAM device. Typically for DRAM memory cells the access transistor in each memory cell is an N-channel FET. Next, lightly doped source/drain regions, self-aligned to the FET gate electrodes, are formed by ion implantation. A spacer insulating layer, such as silicon oxide ($SiO_2$), is deposited and anisotropically etched back to form spacers on the sidewalls of the gate electrodes. A second ion implantation is used to make the source/drain contact regions adjacent to the insulating sidewall spacers to complete the FETs in each of the memory cells.

Continuing, a first insulating layer is deposited over the device areas and the field oxide areas. The first insulating layer is composed of silicon oxide ($SiO_2$) and is deposited by low-pressure chemical vapor deposition (LPCVD). The first insulating layer is then planarized, for example by chemical/mechanical polishing (CMP). Contact openings are etched in the first insulating layer to the source/drain contact areas of each FET. A conductively doped first polysilicon layer is deposited over the first insulating layer and also fills the contact openings to the source/drain contact areas. A silicide layer is deposited over the first polysilicon layer. Conventional photolithographic techniques and anisotropic plasma etching are used to pattern the silicide layer and the first polysilicon layer over the first insulating layer to form polycide bit lines which also extend over the contact openings to one of the two source/drain contact areas to provide bit line contacts for each DRAM cell. Concurrently during the etching, portions of the first polysilicon layer are retained in the contact openings to the second of the source/drain contact areas in each DRAM cell to provide capacitor node contacts in each cell area. After removing the photoresist mask, a second insulating layer, such as $SiO_2$, is deposited and planarized over the bit lines and over the capacitor node contacts.

Photoresist masking and anisotropic plasma etching are used to etch openings in the second insulating layer to the capacitor node contacts. An in-situ doped second polysilicon layer is deposited to fill the openings. The second polysilicon layer is then blanket etched back to the second insulating layer thereby leaving portions of the second polysilicon layer in the openings to form the electrical contacts to the capacitor node contacts.

The array of stacked capacitors having zigzag-shaped bottom electrodes, and further composed of a hemispherical grain (HSG) layer, are formed next. The method involves depositing a third insulating layer, such as silicon nitride ($Si_3N_4$), followed by depositing a disposable multilayer. Preferably the multilayer is composed of a series of two different types of insulators. Alternate layers of the multilayer are of a first type insulator, and the other layers are composed of a second type insulator. Preferably the first and second type insulators are composed of a phosphorus and boron doped $SiO_2$, respectively, having substantially different etch rates in the same etching solution. Photoresist masking and anisotropic plasma etching are used to etch recesses having vertical sidewalls in the multilayer and in the third insulating layer. The recesses are etched over and to the second insulating layer. The etching also exposes the electrical contact to the capacitor node contacts in each of the memory cell areas where the stacked capacitors are desired. The vertical sidewalls of the multilayer are now subjected to an isotropic etching, such as a hydrofluoric (HF) acid solution or an HF vapor etch, which etches the boron-doped oxide significantly faster than the phosphorus-doped oxide, thereby forming a zigzag-shaped profile in the sidewalls of the multilayer. A conformal in-situ doped amorphous silicon layer is deposited over the multilayer and in the recesses using LPCVD and silane at relatively low temperatures (for example, 500° C.). Then a gas flow having a lower $SiH_4$ concentration and an increase in the deposition temperature (for example, 560° C.) are used to provide seeding for nucleation sites for growing the hemispherical grain (HSG) layer. A fourth insulating layer, such as a borophosphosilicate glass (BPSG) or a polymer, is deposited to fill the recesses and to protect the HSG layer from etching in the recesses. The BPSG or polymer is etched back to expose the HSG layer on the top surface of the multilayer. The HSG layer is selectively removed on the top surface of the multilayer. The fourth insulating and the multilayer are removed by isotropic etching to form an array of free standing capacitor bottom electrodes. These bottom electrodes having sidewalls with zigzag profiles and having the HSG structure on the inner surfaces of the capacitor bottom electrodes result in increased surface area and thereby providing increased capacitance.

The array of capacitors is now completed by forming an interelectrode dielectric layer on the bottom electrodes, and then depositing and patterning a fourth polysilicon layer to form the capacitor top electrodes.

The DRAM device having these novel HSG zigzag shaped capacitors can now be completed by conventional semiconductor processing. For example, a fifth insulating layer, such as BPSG, is deposited over the array of stacked capacitors to insulate and to provide a planar surface. Via holes are selectively etched in the fifth insulating layer to the various patterned underlying conducting layers, and metal plugs and multilevels of electrical interconnections are used to complete the DRAM device.

BRIEF DESCRIPTION OF THE DRAWINGS

The objects and advantages of this invention are best understood with reference to the attached drawings in FIGS. 1 through 8, and the embodiment that follows.

DESCRIPTION OF THE PREFERRED EMBODIMENT

Now in keeping with the objects of this invention, the method for making the DRAM cells having these improved zigzag-shaped stacked capacitors is now described in detail. However, it should also be well understood by one skilled in the art that by including additional process steps, in addition to those described in this embodiment, other types of devices can also be included on the DRAM chip. For example, by forming N-well regions in a P doped substrate, P-channel FETs can also be provided from which Complementary Metal-Oxide-Semiconductor (CMOS) circuits can also be formed, such as are used for the peripheral circuits on the DRAM device (chip).

Figure 1:
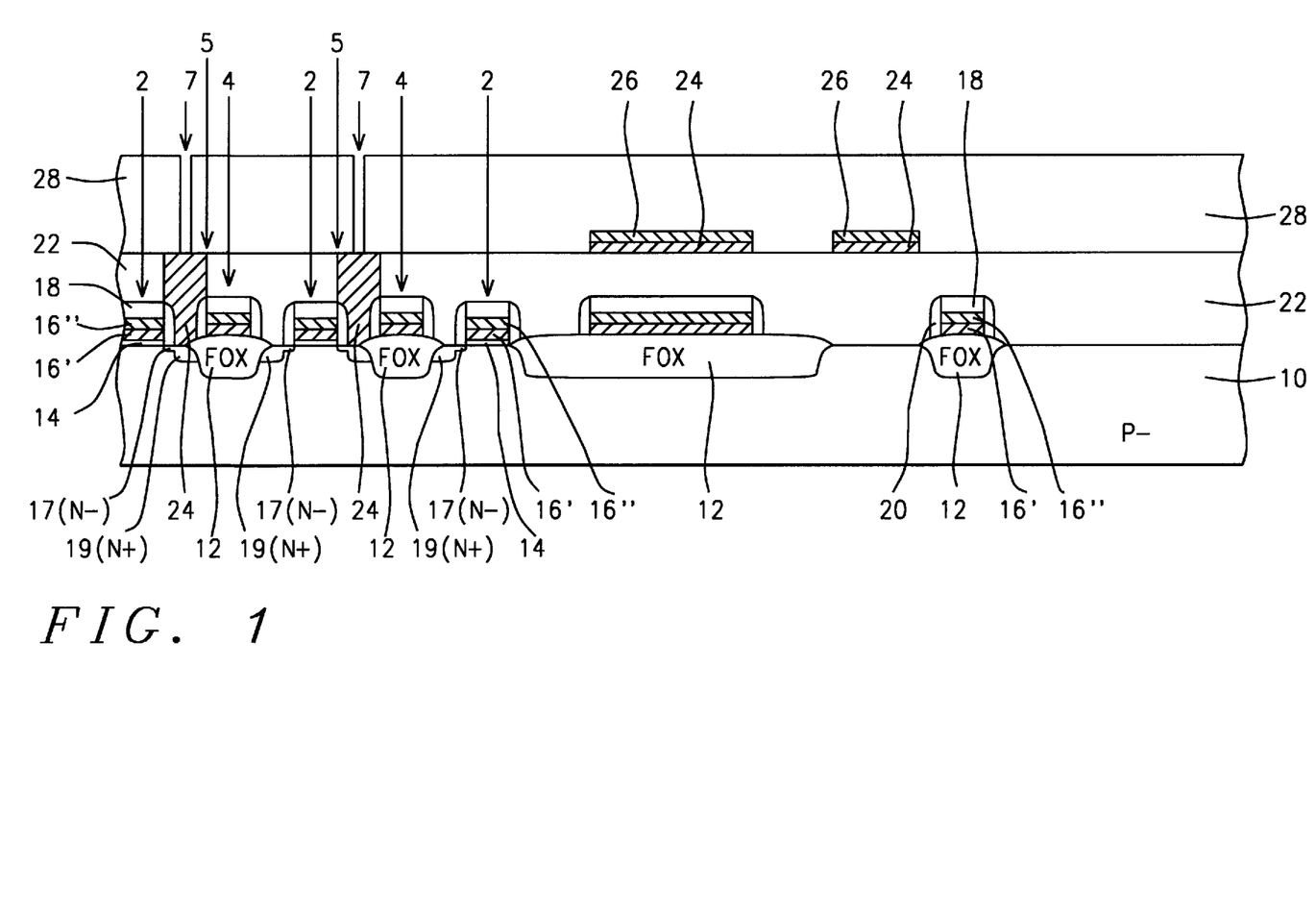
FIGS. 1 through 8 show schematic cross-sectional views for cell regions at the perimeter of the array of DRAM cells illustrating in detail the fabrication steps for making the zigzag-shaped stacked storage capacitor having a hemispherical grain structure by the method of this invention.

Referring first to FIG. 1, a schematic cross-sectional view of a portion of a semiconductor substrate 10 is shown for a partially completed DRAM device having access transistors (N-FETs) formed on and in the substrate surface. The preferred substrate 10 is composed of a lightly doped P type single-crystal silicon having a <100> crystallographic orientation. A relatively thick Field OXide (FOX) 12 is formed to surround and electrically isolate the individual device regions in which the memory cells are built. The most commonly formed field oxide 12 is by the LOCal Oxidation of Silicon (LOCOS) method. Briefly the LOCOS method uses a thin $SiO_2$ (pad oxide) as a stress release layer, and a thicker silicon nitride ($Si_3N_4$) layer that serves as an oxidation barrier layer on the pad oxide on the substrate surface (not shown in FIG. 1). Conventional photolithographic techniques and etching, also not depicted in the drawings, are used to remove the $Si_3N_4$ barrier layer in areas where the field oxide is required, while retaining the $Si_3N_4$ over the active device areas to prevent oxidation. The silicon substrate is then thermally oxidized to form the field oxide areas 12. The field oxide is usually grown to a thickness of between about 3000 and 6000 Angstroms, and the silicon nitride barrier layer and pad oxide are removed in a wet etch. For example, the nitride can be removed in a hot phosphoric acid ($H_3PO_4$) etch, and the pad oxide can be removed in a dilute solution of hydrofluoric acid and water ($HF/H_2O$). Other types of field oxide isolation can also be used which allow even more closely spaced device areas and higher cell density. For example shallow trench isolation (STI) and the like can be used with this invention.

An array of access transistors (N-channel FETs) 2 is now formed in the active device regions, and concurrently word lines 4 are formed over the FOX regions. These FETs are fabricated in and on the device areas on the silicon substrate 10 by first forming a thin gate oxide 14 on the device areas. Typically the gate oxide is formed by thermal oxidation and is grown to a thickness of between about 60 and 120 Angstroms. Next a polysilicon layer 16' is deposited by LPCVD using, for example, silane ($SiH_4$) as the reactant gas. For N-channel FETs, the polysilicon layer 16' is typically doped with an N type dopant, such as arsenic (As) or phosphorus (P), to a concentration of between about $1.0 \, \text{E} \, 19$ and $1.0 \, \text{E} \, 21$ atoms/cm$^3$. Layer 16' is deposited to a preferred thickness of between about 500 and 1000 Angstroms. A refractory metal silicide layer 16" is deposited on the doped polysilicon layer 16'. Typically layer 16" is composed of tungsten silicide ($WSi_2$) and is deposited by CVD using a reactant gas mixture such as tungsten hexafluoride ($WF_6$) and $SiH_4$. Typically, the $WSi_2$ is deposited to a thickness of between about 800 and 1500 Angstroms. Next a cap oxide layer 18, generally composed of $SiO_2$, is deposited using LPCVD by using a reactant gas, such as tetraethosiloxane (TEOS). Conventional photolithographic techniques and anisotropic plasma etching are then used to pattern the polysilicon layer 16' and the silicide layer 16" to form the polycide gate electrodes 16 over the device areas and word lines 16 over the FOX 12 having a cap oxide 18, as shown in FIG. 1.

Still referring to FIG. 1, lightly doped source/drain regions 17(N$^-$) are formed adjacent to the gate electrodes 16 to minimize short-channel effects for these sub-half-micron channel FETs. The lightly doped source/drain regions are formed by ion implantation and are self-aligned to the FET gate electrodes 16. The lightly doped source/drain regions are formed by implanting an N type dopant, such as arsenic (As) or phosphorus (P). For example, a typical implant might consist of phosphorus $P^{31}$ at a dose of between about $1 \, \text{E} \, 13$ and $1 \, \text{E} \, 14$ atoms/cm$^2$ and at an energy of between about 20 and 40 KeV. The gate electrodes serve as an implant mask to self-align the lightly doped source/drain regions 17(N$^-$) to the gate electrodes, while an additional patterned photoresist can be used to prevent implantation elsewhere on the substrate where it is not required.

After forming the lightly doped source/drain regions 17(N$^-$), sidewall spacers 20 are formed on the sidewalls of the gate electrode 16, as shown in FIG. 1. For example, the sidewall spacers can be formed by depositing an insulating layer 20 such as a silicon oxide and blanket etched back. Layer 20 can be deposited using LPCVD and a reactant gas such as TEOS/ozone at a temperature in the range of about 650 to 900° C. The etchback is carried out in a reactive ion etcher (RIE) or high-density plasma (HDP) etcher using an etching gas such as trifluoromethane ($CHF_3$). The FETs are now completed by forming heavily doped source/drain contact areas 19(N$^+$) aligned to the sidewall spacers 20 and on each side of the gate electrodes. For example, the heavily doped source/drain contact areas 19(N$^+$) can be formed by ion implanting $As^{75}$. The source/drain areas 19(N$^+$) are typically doped to a final concentration of between about $1.0 \, \text{E} \, 19$ and $1.0 \, \text{E} \, 21$ atoms/cm$^3$ to provide low-resistance ohmic contacts. Alternatively, the source/drain contact areas 19(N$^+$) can be formed at a later processing step by outdiffusing an N$^+$ dopant from a polysilicon source.

Continuing with FIG. 1, a first insulating layer 22 is deposited over the FETs in the device areas and the FOX areas 12. Preferably the first insulating layer is composed of silicon oxide ($SiO_2$). For example, layer 22 can be deposited by LPCVD using a reactant gas such as TEOS/ozone. The first insulating layer 22 is then planarized to a thickness of between about 3000 and 4500 Angstroms over the FETs. One method of globally planarizing layer 22 is by chemical/mechanical polishing (CMP) using an appropriate polishing slurry. Alternatively, layer 22 can be a low-temperature glass, such as borophosphosilicate glass (BPSG), and locally planarized by thermal annealing.

Continuing with FIG. 1, conventional photolithographic and anisotropic plasma etching are used to etch contact openings 5 in the first insulating layer 22 to the source/drain contact areas 19 of each FET. For example, the etching can be carried out using reactive ion etching (RIE) or high-density plasma (HDP) etching and an etching gas such as $CHF_3$, which etches the $SiO_2$ selectively to the silicon substrate. FIG. 1 shows a cross section through the contact openings 5 for the capacitor node contacts. Contact openings for the bit lines are etched at the same time, but are not depicted in drawing in FIG. 1. The bit lines and the capacitor node contacts are now formed concurrently by depositing a conductively doped first polysilicon layer 24 over the first insulating layer. Layer 24 also fills the contact openings in both the bit line contact openings (not shown) and the contact openings 5 for the capacitor node contacts. The first polysilicon layer 24 is preferably deposited by LPCVD using a reactant gas such as $SiH_4$, and is in-situ doped N$^+$ by including a dopant gas such phosphine ($PH_3$) during deposition. Layer 24 is doped to a preferred concentration of between about $1.0 \, \text{E} \, 19$ and $1.0 \, \text{E} \, 21$ atoms/cm$^3$. The preferred thickness of layer 24 is between about 500 and 1500 Angstroms. Next, a refractory metal silicide layer 26 is deposited over the first polysilicon layer 24. Layer 26 is preferably composed of a $WSi_2$, deposited by LPCVD using $WF_6$ and $SiH_4$ as the reactant gas mixture, and is deposited to a thickness of between about 800 and 1500 Angstroms. The silicide layer 26 and the first polysilicon layer 24 are then patterned using conventional photolithographic techniques and anisotropic plasma etching to form polycide bit lines over the bit line contact openings (not shown) to the source/drain contact areas. However, portions of the polycide layer (layers 26 and 24) are depicted at the perimeter of the memory cells in FIG. 1. Concurrently, during patterning of the polycide to form the bit lines, the polysilicon layer 24 is etched to the surface of the first insulating layer 22, leaving portions of layer 24 in the openings 5 to provide capacitor node contacts, also labeled 24, two of which are shown in FIG. 1. Next, a second insulating layer 28, such as $SiO_2$, is deposited over the bit lines and over the capacitor node contacts 5. Layer 28 is deposited, for example, similar to the deposition of the first insulating layer 22. Layer 28 is then planarized to have a thickness of between about 5000 and 8000 Angstroms over the patterned polycide layer (layers 24 and 26) that are used for the bit lines. For example, layer 28 can be planarized using CMP. Photoresist masking and anisotropic plasma etching are used to etch contact openings 7 in the second insulating layer 28 to the polysilicon capacitor node contacts 24 in the openings 5. The etching can be carried out using HDP etching and an etchant gas such as $CHF_3$, which etches the oxide selectively to the underlying polysilicon.

Figure 2:
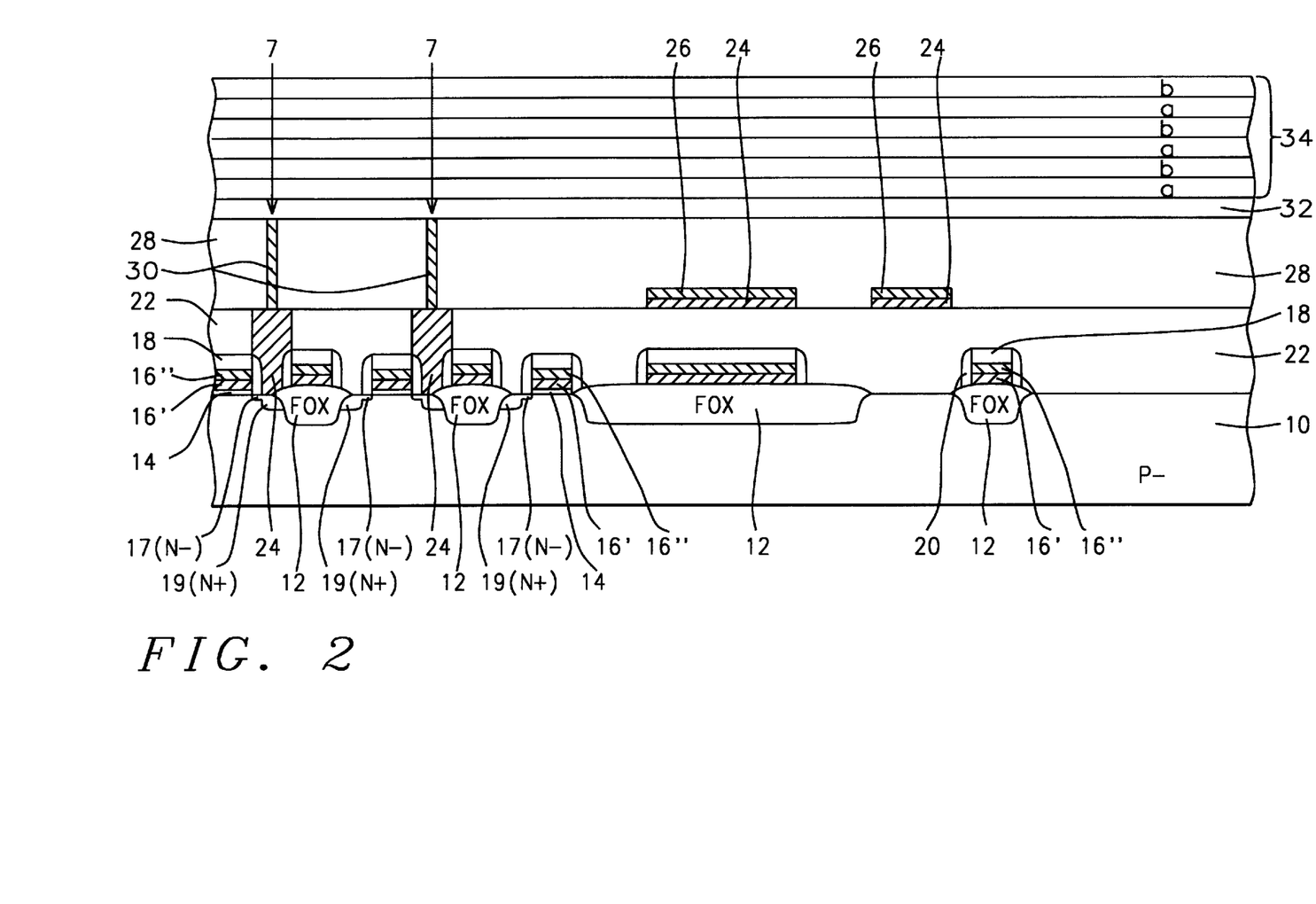

Referring to FIG. 2, a conformal in-situ doped second polysilicon layer 30 is deposited to a thickness sufficient to fill the contact openings 7 to form electrical contacts to the node contacts 24. Layer 30 is deposited by LPCVD using $SiH_4$ as the reactant gas, and is doped using, for example, $PH_3$ to a concentration of between about 1.0 E 19 and 1.0 E 21 atoms/cm$^3$. The second polysilicon layer 30 is then blanket etched back to the second insulating layer 28 thereby leaving portions of the second polysilicon layer 30 in the node contact openings 7 to complete the capacitor node contacts. For example, the polysilicon can be etched back using RIE and an etchant gas such as that etches the polysilicon selectively to the underlying oxide. For example, a gas mixture containing a chlorine species, such as chlorine ($Cl_2$), or hydrogen bromide (HBr) with oxygen ($O_2$) can be used. Alternatively layer 30 can be chemical/mechanically polished back to the second insulating layer 28.

Referring to FIG. 2, and more specifically to the method for making this novel capacitor having a zigzag-shaped bottom electrodes and a hemispherical grain (HSG) structure, a third insulating layer 32 is deposited. Layer 32, which will later serve as an etch-stop layer, is preferably composed of silicon nitride. For example, the $Si_3N_4$ can be deposited by LPCVD using a gas mixture such as dichlorosilane ($SiCl_2H_2$) and ammonia ($NH_3$). Layer 32 is deposited to a preferred thickness of between about 60 and 150 Angstroms, but to a thickness not greater than 2000 Angstroms.

Also shown in FIG. 2 and continuing with the process for making the capacitor, a disposable multilayer 34 is deposited. Preferably the multilayer is composed of a series of two different alternating types of insulators a and b. The number of layers is at least 3, but preferably is between 3 and 12 layers. The alternate layers of insulators a and b are preferably composed of a phosphosilicate glass (PSG) and a borosilicate glass (BSG), respectively. The doped oxide layers in the multilayer 34 can be deposited sequentially in a LPCVD system or a plasma-enhanced CVD (PECVD) system using, for example, TEOS/ozone as the reactant gas, while doping the alternate layers a and b with phosphine ($PH_3$), and diborane hydride ($B_2H_6$), respectively. Preferably the PSG is doped to a concentration of between about 5 and 15 weight percent (wt %) with phosphorus, and the BSG is doped to a concentration of between about 5 and 15 wt % with boron. The boron-doped oxides etch faster while the phosphorus-doped oxides etch slower resulting in significantly different etch rates in the same etching solution. The etch-rate ratio of the boron-doped oxides to the phosphorus-doped oxides is between about 3:1 and 10:1. The difference in etch rates is later used in the process to form the zigzag-shaped capacitor bottom electrodes.

Figure 3:
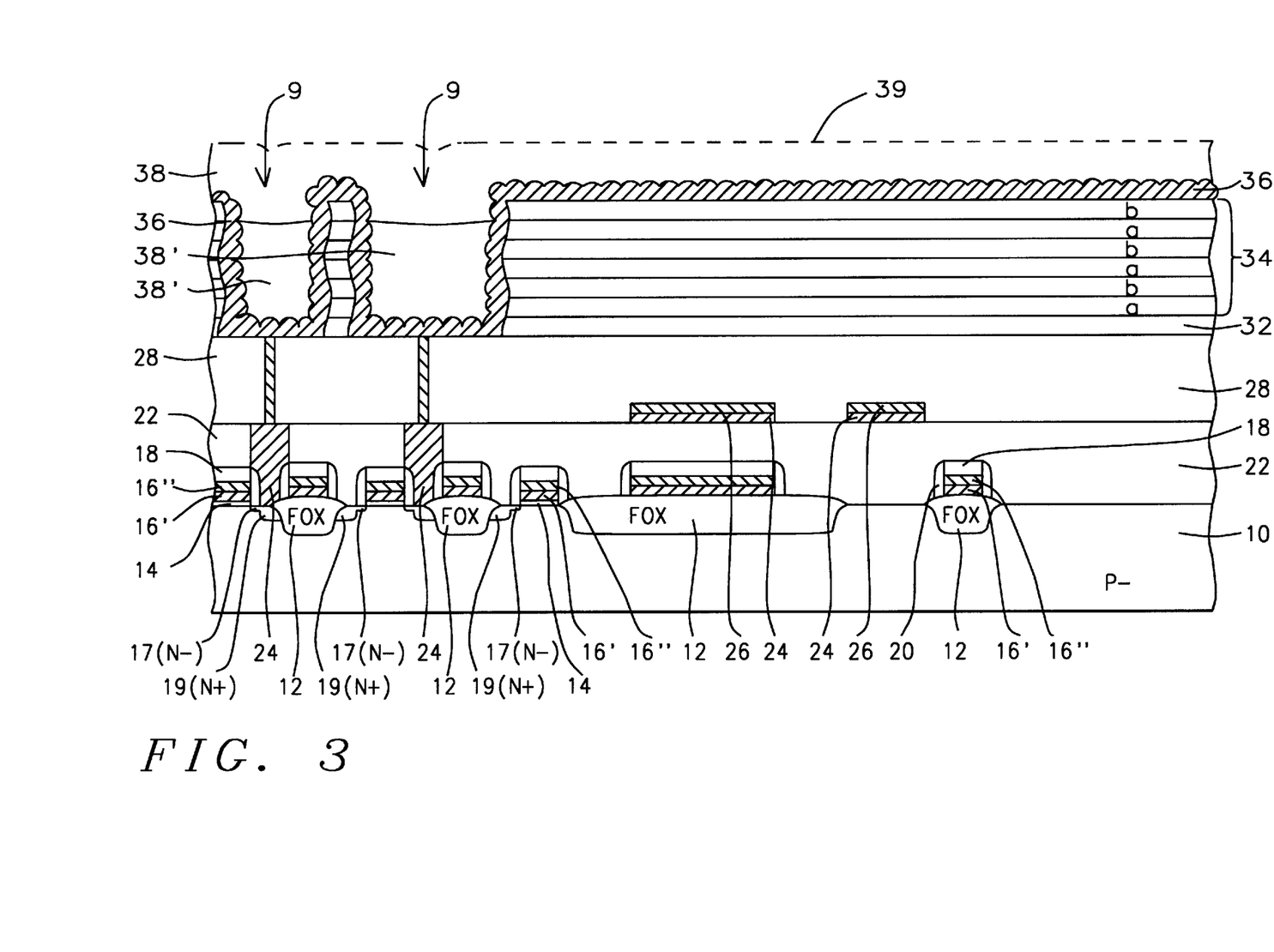

Referring to FIG. 3 and continuing with the process, conventional photolithographic techniques and anisotropic plasma etching are used to etch an array of recesses 9 in the multilayer 34 and in the third insulating layer 32, one recess over each cell area in which the capacitor bottom electrodes will be formed. Two of the recesses 9 are shown in FIG. 3 having essentially vertical sidewalls. The recesses are preferably etched using RIE or HDP etching and an etchant gas such as carbon tetrafluoride ($CF_4$) and a carrier gas such as argon (Ar). The recesses 9 are etched over and down to the capacitor node contact formed from the polysilicon layers 24 and 30.

Also as shown in FIG. 3, the vertical sidewalls of the multilayer 34 in the recesses 9 are now subjected to an isotropic etch that etches the BSG layers (b layers) at a faster etch rate than the PSG layers (a layers), resulting in a zigzag-shaped profile in the sidewalls of the multilayer 34. Preferably the multilayer is etched using a dilute hydrofluoric acid solution (HF/$H_2O$) or a buffered oxide etch (BOE) containing a buffering agent such as ammonium fluoride ($NH_4F$). Alternatively, the isotropic etching can be performed using an HF vapor etch. Still another method is to use RIE and an etchant gas such as $CF_4$ or trifluoromethane ($CHF_3$) with a carrier gas such as Ar. However, the preferred method is wet etching in HF/$H_2O$ which enhances the zigzag shape.

Still referring to FIG. 3, next an $N^+$ doped conformal amorphous silicon layer 36 is deposited and is converted to a hemispherical gain (HSG) layer to form the capacitor bottom electrodes. Layer 36 is deposited in a LPCVD system using $SiH_4$ as the reactant gas, and is in-situ doped with phosphorus to a preferred concentration of between about 1.0 E 19 and 1.0 E 21 atoms/cm$^3$. The preferred thickness of layer 36 is between about 500 and 700 Angstroms.

To provide an amorphous layer, the deposition is carried out at a relatively low temperature between about 500 and 550° C., and more particularly at about 500° C. The preferred gas mixture is $SiH_4$ and nitrogen ($N_2$) or Ar at a total flow rate of between about 100 and 1000 standard cubic centimeters per minute (sccm), where the $SiH_4$ flow rate is between about 10 and 160 sccm. The deposition is then continued at an elevated temperature of between about 530 and 580° C., and more specifically at a temperature of about 560° C., and at a total flow rate of between about 100 and 1000 sccm where the $SiH_4$ flow rate is reduced to between about 1 and 10 sccm. The increased temperature and reduced flow rate of $SiH_4$ provide seeding for nucleation sites for growing a hemispherical grain (HSG) layer.

Still referring to FIG. 3, a fourth insulating layer 38, such as a borophosphosilicate glass (BPSG) or a polymer, is deposited to fill the recesses 9 and to protect the HSG layer 36 from etching in the recesses. The BPSG or polymer is then etched back to expose the HSG layer 36 on the top surface of the multilayer 34. The BPSG layer 38 is deposited using LPCVD and a reactant gas such as TEOS/$O_3$, and is in-situ doped with phosphorus and boron. The BPSG is deposited to a thickness sufficient to fill the recesses 9, but is at least greater than one-half the width of the recesses 9 to form an essentially planar surface over the array of recesses, as depicted by the broken line 39 in FIG. 3. The BPSG layer 38 is then blanket etched back, for example by plasma etching using an etchant gas such as $CHF_3$, to leave portions 38' in the recesses, as depicted in FIG. 3. Alternatively, a polymer, such as a photoresist, can be spin-coated to fill the recesses and plasma ashed back in oxygen to leave portions in recesses 9, also depicted as portions 38' in FIG. 3.

Figure 4:
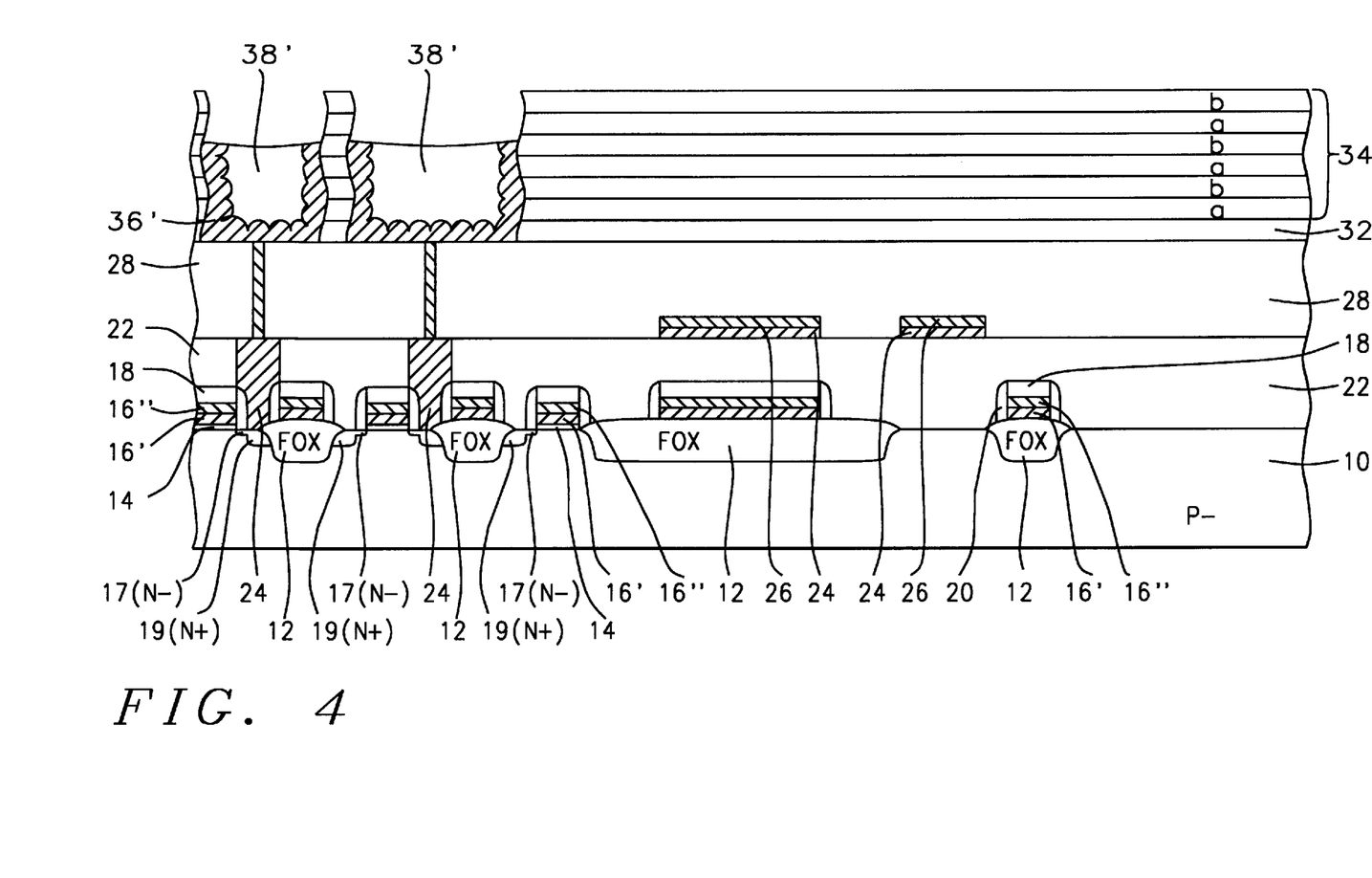

Referring to FIG. 4, using insulating portions 38' as an etch-stop mask to protect the HSG layer 36 in the recesses 9, the HSG layer 36 is selectively removed on the top surface of the multilayer 34. Layer 36 is etched in either a RIE or HDP etcher using an etchant gas containing a chlorine (Cl) species. The remaining HSG portions 36' in the recesses 9 serve as the array of capacitor bottom electrodes having the zigzag-shaped sidewalls and HSG structure on the inner surface of the sidewalls.

Figure 5:
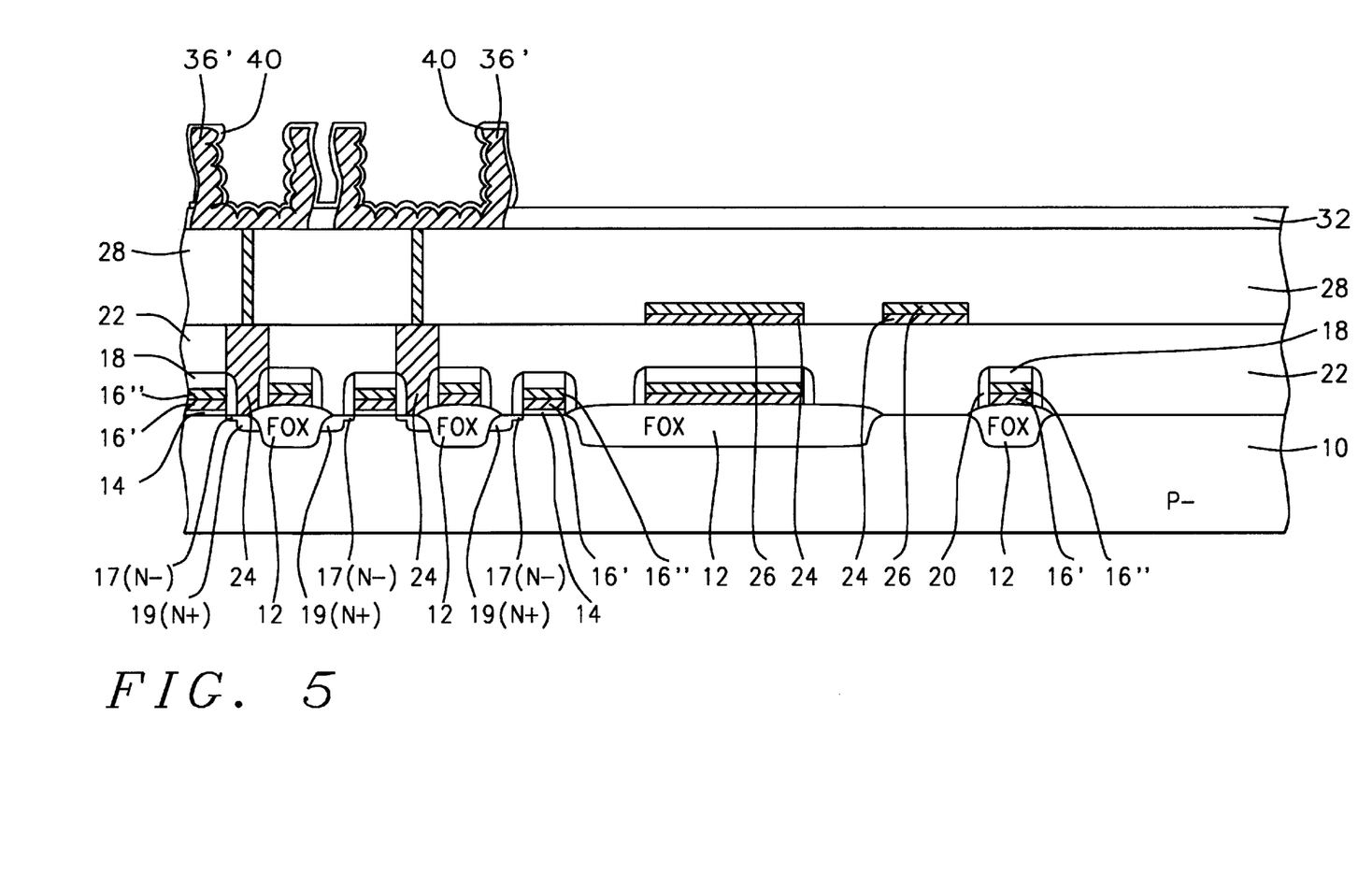

Referring next to FIG. 5, the remaining portion of the fourth insulating layer 38' (BPSG) and the multilayer 34 are concurrently removed by isotropic etching to form an array of freestanding capacitor bottom electrodes 36'. The insulating layer 38' and multilayer 34 can be removed by etching in an HF solution. The third insulating layer 32 composed of $Si_3N_4$ serves as an etch-stop layer during the HF etch to protect the underlying device structures. Alternatively, if a polymer is used for layer 38, then the HF etch can be followed by an oxygen ashing to remove the portions 38' in the capacitor bottom electrodes 36'. These bottom electrodes having sidewalls with zigzag profiles and having the HSG structure on the inner surfaces of the capacitor bottom electrodes result in increased surface area and thereby providing increased capacitance.

Still referring to FIG. 5, the array of capacitors is now completed by forming a thin interelectrode dielectric layer 40 having a high dielectric constant on the surface of the bottom electrode 36' as depicted in FIG. 5. Layer 40 is preferably composed of layers of $SiO_2/Si_3N_4/SiO_2$ (ONO). The ONO dielectric can be formed by growing a thermal oxide on the polysilicon bottom electrodes 36', depositing a $Si_3N_4$ layer by LPCVD, and then using an oxidation furnace to form the top $SiO_2$ by partially reducing the $Si_3N_4$ layer. Preferably the ONO is formed having a thickness of between about 52 and 60 Angstroms. Alternatively, layer 40 can be other high-dielectric constant materials, such as tantalum pentoxide ($Ta_2O_5$) or can be used in conjunction with ONO to form the high-dielectric-constant layer 40.

Figure 6:
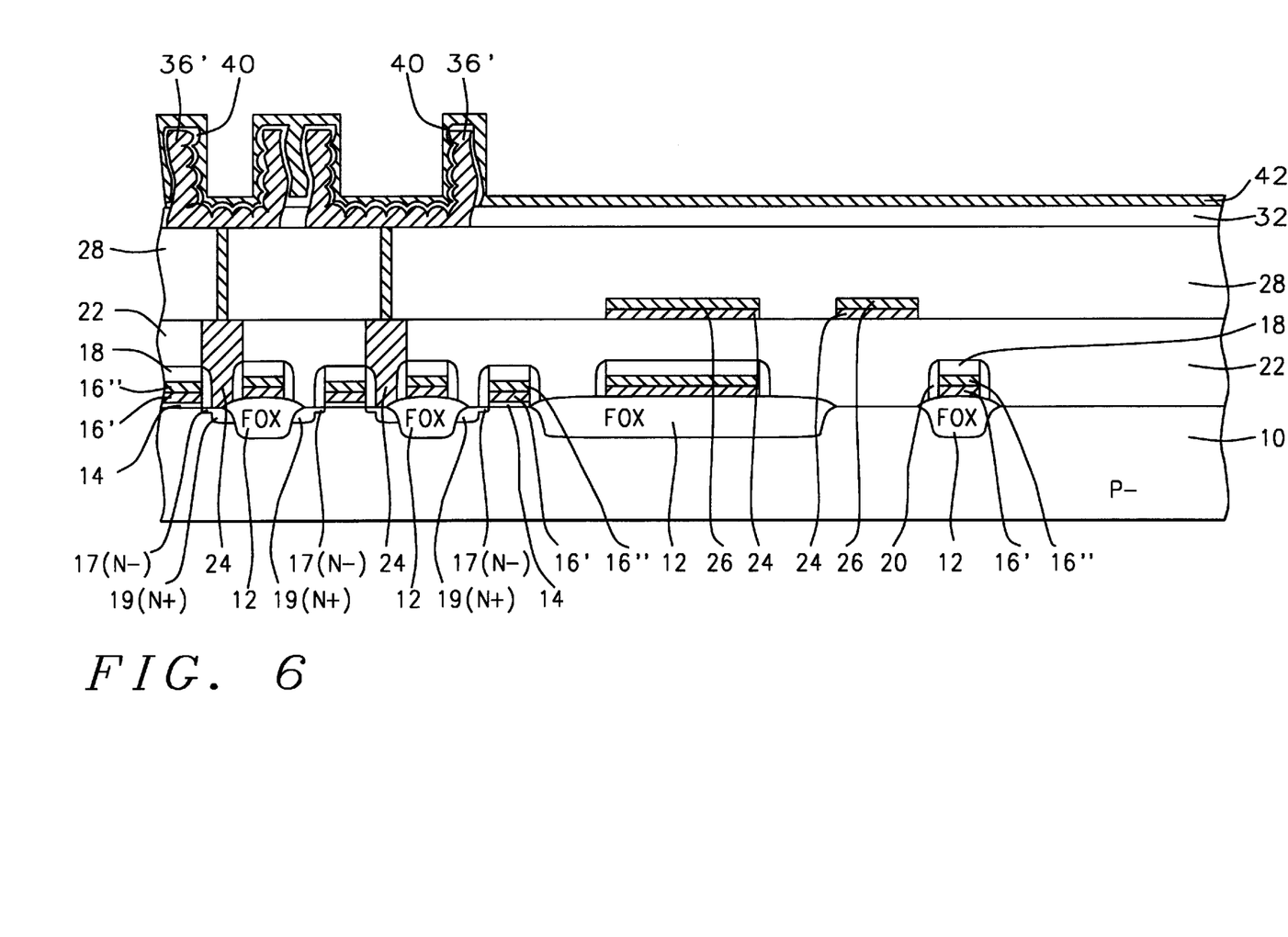

Referring to FIG. 6, a conformal, in-situ doped fourth polysilicon layer 42 is deposited, for example by LPCVD using a reactant gas such $SiH_4$, and using a dopant gas such as $PH_3$. Layer 42 is doped $N^+$ to a preferred concentration of between about $1.0 \text{ E } 19$ and $1.0 \text{ E } 21$ atoms/cm$^3$. The preferred thickness of layer 42 is between about 1000 and 1500 Angstroms.

Figure 7:
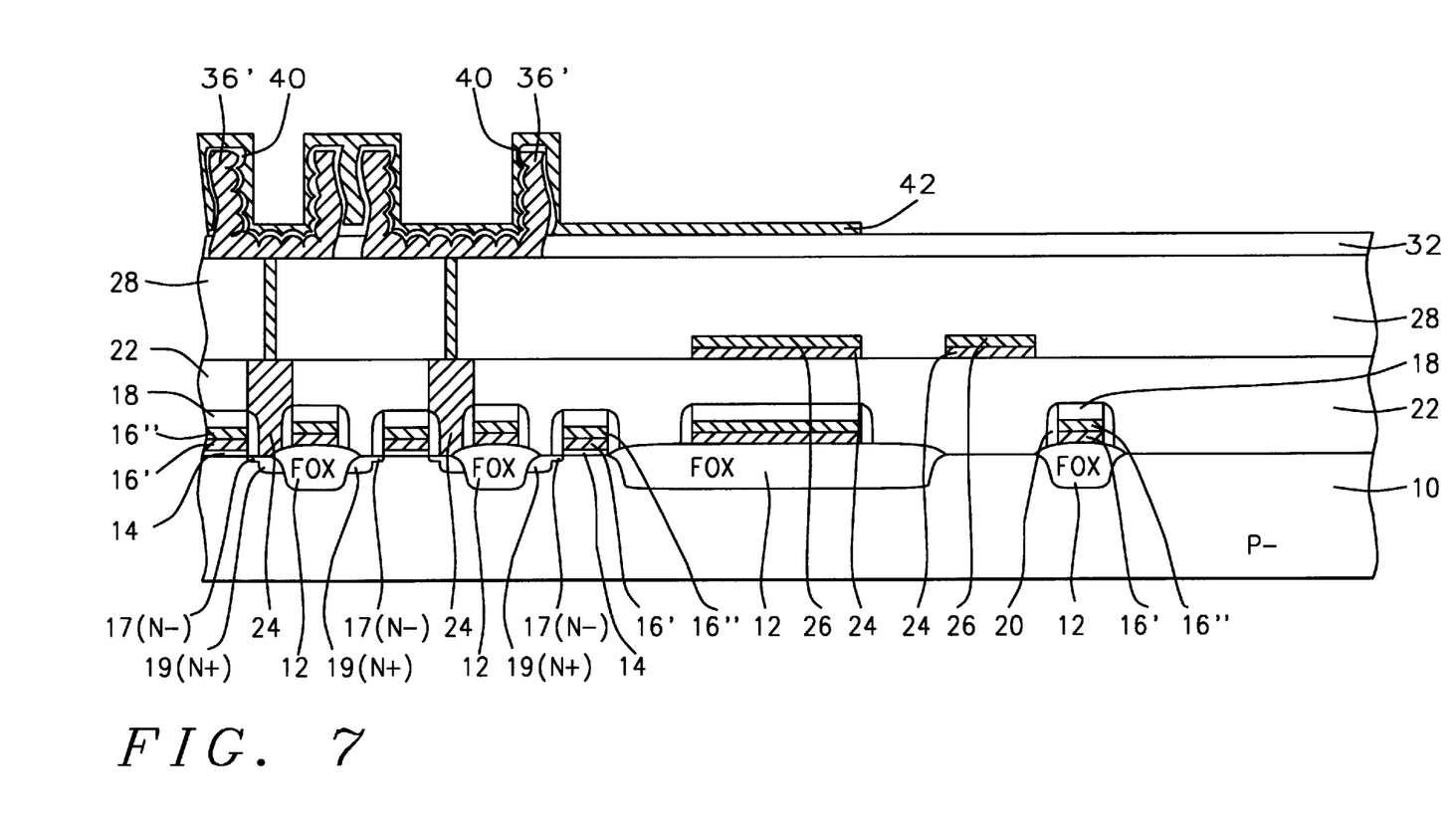

Referring to FIG. 7, the fourth polysilicon layer 42 is patterned to form the top electrodes 42 to complete the array of dynamic random access memory (DRAM) cells having these novel HSG zigzag-shaped stacked capacitors having increased capacitance.

Figure 8:
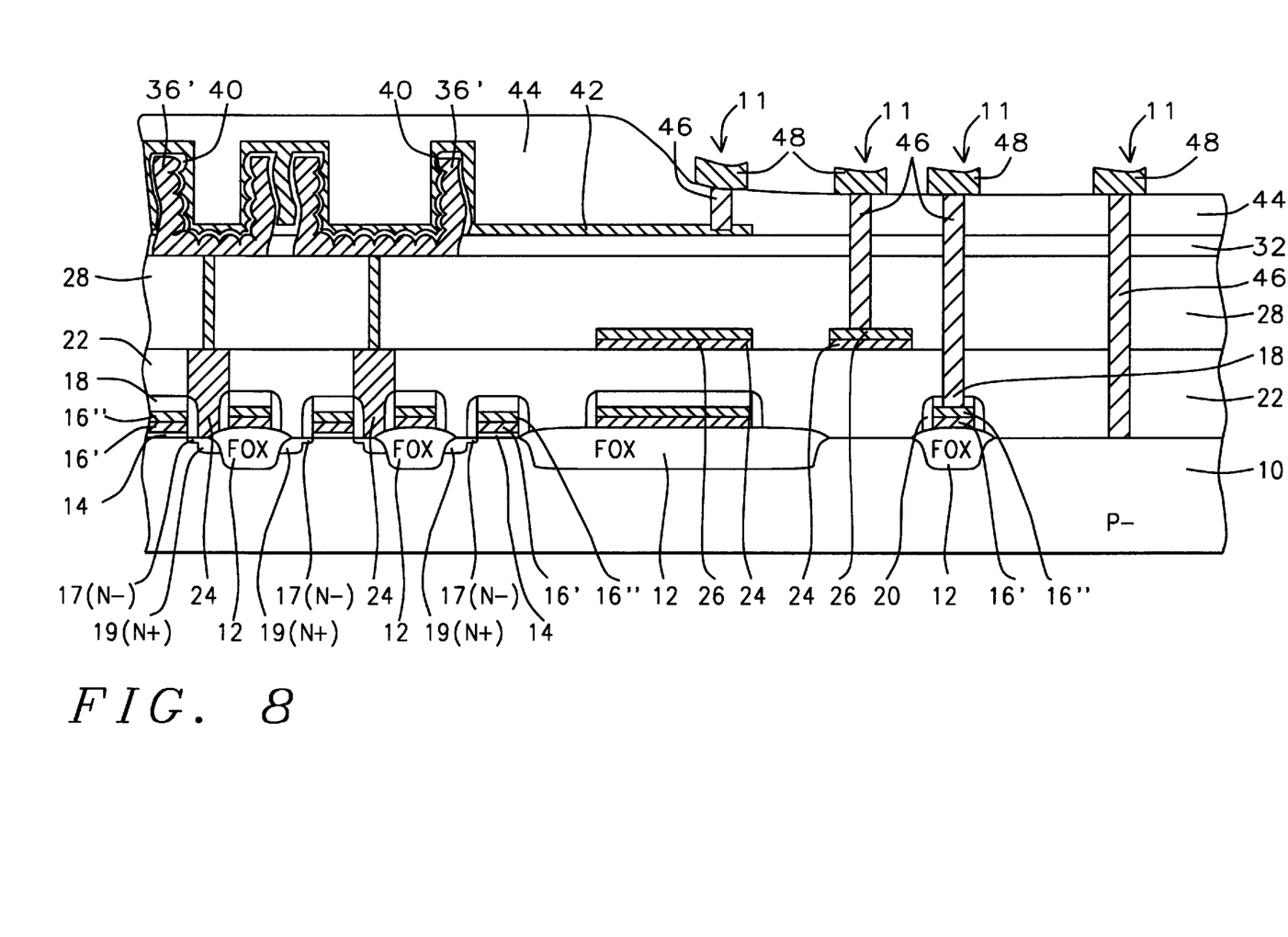

Referring to FIG. 8, the DRAM devices are now completed to the next level of electrical interconnections by depositing a fifth insulating layer 44, such as BPSG. Via holes 11 are selectively etched to the substrate 10 and to the various patterned conducting layers, such as the gate electrodes 16, the patterned layers 26 and 24 used for the bit lines, and the contacts to the capacitor top electrodes 42. The via holes 11 are then filled with metal plugs, such as tungsten plugs 46, and the first metal layer, such as an aluminum/copper alloy, is deposited and patterned to form the next level of electrical interconnections 48.

While the invention has been particularly shown and described with reference to the preferred embodiment thereof, it will be understood by those skilled in the art that various changes in form and details may be made without departing from the spirit and scope of the invention.

What is claimed is:

1. A method for fabricating an array of dynamic random access memory (DRAM) cells having zigzag-shaped stacked capacitors on a semiconductor substrates, comprising the steps of:

providing said semiconductor substrate having device areas surrounded by field oxide areas, and each device area having a field effect transistor (FET), each of said transistors having a polycide gate electrode and source/drain contact areas;

forming a planar first insulating layer over said device areas and said field oxide areas;

forming contact openings in said first insulating layer to said source/drain contact areas;

depositing a first polysilicon layer over said first insulating layer and filling said contact openings;

depositing a silicide layer over said first polysilicon layer;

photoresist masking and anisotropic plasma etching said silicide layer and said first polysilicon layer to said first insulating layer to form polycide bit lines and extending over some of said contact openings to provide bit line contacts, and concurrently leaving portions of said first polysilicon layer in remaining said contact openings to said source/drain areas to form node contacts for said stacked capacitors;

depositing a second insulating layer over said bit lines and over said node contacts, and thereafter forming said stacked capacitors by;

selectively and anisotropically etching openings in said second insulating layer to said node contacts for said stacked capacitors, depositing and blanket etching back a second polysilicon layer to said second insulating layer thereby leaving portions of said second polysilicon layer in said openings to form electrical contacts to said node contacts, depositing a third insulating layer;

depositing a multilayer of two insulator types having alternate layers composed of one insulator type and the other layers composed of the second insulator type, and said second insulator type, composed of a borosilicate glass (BSG), and having a different etch rate than said second insulator type, masking and anisotropically plasma etching recesses having vertical sidewalls in said multilayer and said third insulating layer to said second insulating layer and exposing said electrical contacts to said node contacts, isotropically etching said multilayer in sate vertical sidewalls having said alternate layers with said different etch rates, and thereby forming a zigzag-shaped profile in said sidewalls, depositing a conformal amorphous silicon layer over and in said recesses and annealing to form a hemispherical grain (HSG) layer for capacitor bottom electrodes, depositing and etching back a fourth insulating layer to fill said recesses and exposing said HSG layer on the top surface of said multilayer, selectively etching back and removing said HSG layer on said top surface of said multilayer, while said fourth insulating layer prevents etching of said HSG layer in said recesses, isotropically removing said fourth insulating layer and said multilayer to form an array of freestanding said capacitor bottom electrodes having zigzag sidewall profiles with said HSG structure on inner surfaces of said capacitor bottom electrodes, forming an interelectrode dielectric layer on said bottom electrodes, depositing and patterning & fourth polysilicon layer and patterning to form the capacitor top electrodes and thereby completing said array of DRAM cells.

2. The method of claim 1, wherein said first insulating layer is composed of silicon oxide ($SiO_2$) and has a thickness of between about 3000 and 4500 Angstroms.

3. The method of claim 1, wherein said second insulating layer is silicon oxide ($SiO_2$) and has a thickness of between about 5000 and 8000 Angstroms.

4. The method of claim 1, wherein said first, second, third, and fourth polysilicon layers and said amorphous silicon layer are doped with an N-type conductive dopant to a concentration of between about 1.0 E 19 and 1.0 E 21 atoms/cm$^3$.

5. The method of claim 4, wherein said N-type dopant is phosphorus (P).

6. The method of claim 1, wherein said third insulating layer is silicon nitride and has a thickness of between about 60 and 150 Angstroms.

7. The method of claim 1, wherein said multilayer is composed of alternate layers of doped silicon oxide glass, said one insulator type is composed of a phosphosilicate glass (PSG).

8. The method of claim 1, wherein each layer of said multilayer is deposited to a thickness of between about 500 and 3000 Angstroms.

9. The method of claim 1, wherein said isotropic etching of said multilayer in said vertical sidewalls is carried out in a hydrofluoric (HF) acid solution.

10. The method of claim 1, wherein said amorphous silicon layer is deposited at a temperature of between about 500 and 550 degrees centigrade using LPCVD and a reactant gas of $SiH_4$, and is in-situ doped with phosphorus, and is then annealed at a temperature of between about 530 and 580 degrees centigrade to form said hemispherical grain (HSG) layer.

11. The method of claim 1, wherein said amorphous silicon layer is deposited to a thickness of between about 500 and 700 Angstroms.

12. The method of claim 1, wherein said interelectrode dielectric layer is composed of a silicon oxide/silicon nitride/silicon oxide (ONO) having a thickness of between about 10 and 100 Angstroms.

13. A method for fabricating an array of dynamic random access memory (DRAM) cells having zigzag-shaped stacked capacitors on a semiconductor substrates, comprising the steps of:

providing said semiconductor substrate having device areas surrounded by field oxide areas, and each device area having a field effect transistor (FET), each of said transistors having a polycide gate electrode and source/drain contact areas;

forming a planar first insulating layer over said device areas and said field oxide areas;

forming contact openings in said first insulating layer to said source/drain contact areas;

depositing a first polysilicon layer over said first insulating layer and filling said contact openings;

depositing a silicide layer over said first polysilicon layer;

photoresist masking and anisotropic plasma etching said silicide layer and said first polysilicon layer to said first insulating layer to form polycide bit lines and extending over some of said contact openings to provide bit line contacts, and concurrently leaving portions of said first polysilicon layer in remaining said contact openings to said source/drain areas to form node contacts for said stacked capacitors;

depositing a second insulating layer over said bit lines and over said node contacts, and thereafter forming said stacked capacitors by;

selectively and anisotropically etching openings in said second insulating layer to said node contacts for said stacked capacitors, depositing and blanket etching back a second polysilicon layer to said second insulating layer thereby leaving portions of said second polysilicon layer in said openings to form electrical contacts to said node contacts, depositing a third insulating layer;

depositing a multilayer of two insulator types having alternate layers composed of one insulator type and the other layers composed of the second insulator type, and said two insulator types having different etch rates in the same etchant, where said one insulator type is composed of a phosphosilicate glass (PSG), and said other insulator type is composed of a borosilicate glass (BSG), masking and anisotropically plasma etching recesses having vertical sidewalls in said multilayer and said third insulating layer to said second insulating layer and exposing said electrical contacts to said node contacts, isotropically etching said multilayer in said vertical sidewalls having said alternate layers with said different etch rates, and thereby forming a zigzag-shaped profile in said sidewalls, depositing a conformal amorphous silicon layer over and in said recesses and annealing to form a hemispherical grain (HSG) layer for capacitor bottom electrodes, depositing and etching back a fourth insulating layer to fill said recesses and exposing said HSG layer on the top surface of said multilayer, selectively etching back and removing said HSG layer on said top surface of said multilayer, while said fourth insulating layer prevents etching of said HSG layer in said recesses, isotropically removing said fourth insulating layer and said multilayer to form an array of freestanding said capacitor bottom electrodes having zigzag sidewall profiles with said HSG structure on inner surfaces of said capacitor bottom electrodes, forming an interelectrode dielectric layer on said bottom electrodes, depositing and patterning a fourth polysilicon layer and patterning to form the capacitor top electrodes and thereby completing said array of DRAM cells.

14. The method of claim 13, wherein said first insulating layer is composed of silicon oxide ($SiO_2$) and has a thickness of between about 3000 and 4500 Angstroms.

15. The method of claim 13, wherein said second insulating layer is silicon oxide ($SiO_2$) and has a thickness of between about 5000 and 8000 Angstroms.

16. The method of claim 13 wherein said first, second, third, and fourth polysilicon layers and said amorphous silicon layer are doped with an N-type conductive dopant to a concentration of between about 1.0 E 19 and 1.0 E 21 atoms/cm$^3$.

17. The method of claim 16, wherein said N-type dopant is phosphorus (P).

18. The method of claim 13, wherein said third insulating layer is silicon nitride and has a thickness of between about 60 and 150 Angstroms.

19. The method of claim 13, wherein said phosphosilicate glass (PSG) is doped with phosphorus to a concentration of between about 5 and 15 weight percent (wt %), and said borosilicate glass (BSG) is doped with boron to a concentration of between about 5 and 15 wt %.

20. The method of claim 13, wherein each layer of said multilayer is deposited to a thickness of between about 500 and 3000 Angstroms.

21. The method of claim 13, wherein said isotropic etching of said multilayer in said vertical sidewalls is carried out in a hydrofluoric (HF) acid solution.

22. The method of claim 13, wherein said amorphous silicon layer is deposited at a temperature of between about 500 and 550 degrees centigrade using LPCVD and a reactant gas of SiH$_4$, and is in-situ doped with phosphorus, and is then annealed at a temperature of between 530 and 580 degrees centigrade to form said hemispherical grain (HSG) layer.

23. The method of claim 13, wherein said amorphous silicon layer is deposited to a thickness of between about 500 and 700 Angstroms.

24. The method of claim 13, wherein said interelectrode dielectric layer is composed of a silicon oxide/silicon nitride/silicon oxide (ONO) having a thickness of between about 10 and 100 Angstroms.

* * * * *